US008916442B2

(12) United States Patent
Vakada et al.

(10) Patent No.: US 8,916,442 B2
(45) Date of Patent: Dec. 23, 2014

(54) METHOD OF FORMING STEP DOPING CHANNEL PROFILE FOR SUPER STEEP RETROGRADE WELL FIELD EFFECT TRANSISTOR AND RESULTING DEVICE

(71) Applicant: GLOBALFOUNDRIES Inc., Grand Cayman (KY)

(72) Inventors: Vara Govindeswara Reddy Vakada, Fishkill, NY (US); Laegu Kang, Hopewell Junction, NY (US); Michael P. Ganz, Fishkill, NY (US); Yi Qi, Fishkill, NY (US); Puneet Khanna, Wappinger Falls, NY (US); Sri Charan Vemula, Fishkill, NY (US); Srikanth Samavedam, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/743,886

(22) Filed: Jan. 17, 2013

(65) Prior Publication Data
US 2014/0197411 A1      Jul. 17, 2014

(51) Int. Cl.
*H01L 29/66* (2006.01)
*H01L 27/088* (2006.01)

(52) U.S. Cl.
CPC ........ *H01L 29/66477* (2013.01); *H01L 27/088* (2013.01)
USPC ........................................... 438/296; 257/57

(58) Field of Classification Search
None
See application file for complete search history.

(56) References Cited

U.S. PATENT DOCUMENTS 7,851,313 B1 * 12/2010 Luo et al. ...................... 438/285
8,120,075 B1 *  2/2012 Luo et al. ...................... 257/288

OTHER PUBLICATIONS

Hokazono et al., Steep Channel Profiles in n/pMOS Controlled by Boron-doped Si:C Layers for Continual Bulk-CMOS Scaling, pp. 673-676, IEDM09.
Hokazono et al., Steep Channel & Halo Profiles utilizing Boron-Diffusion-Barrier Layers (Si:C) for 32 nm Node and Beyond, pp. 112-113, Symposium on VLSI Technology Digest of Technical Papers (2008).

* cited by examiner

*Primary Examiner* — Seahvosh Nikmanesh
(74) *Attorney, Agent, or Firm* — Ditthavong & Steiner, P.C.

(57) ABSTRACT

A methodology enabling the formation of steep channel profiles for devices, such as SSRW FETs, having a resultant channel profiles that enables suppression of threshold voltage variation and the resulting device are disclosed. Embodiments include providing STI regions in a silicon wafer; performing a deep well implantation of a dopant into the silicon wafer between STI regions; forming a recess in the doped silicon wafer between the STI regions; performing a shallow well implantation of the dopant into the silicon wafer in the recess; and forming Si:C on the doped silicon wafer in the recess.

12 Claims, 4 Drawing Sheets

BACKGROUND

BACKGROUND

BACKGROUND

US 8,916,442 B2

METHOD OF FORMING STEP DOPING CHANNEL PROFILE FOR SUPER STEEP RETROGRADE WELL FIELD EFFECT TRANSISTOR AND RESULTING DEVICE

TECHNICAL FIELD

The present disclosure relates to super steep retrograde well (SSRW) field effect transistors (FETs). The present disclosure is particularly applicable to bulk CMOS based SSRW FETS using carbon-doped silicon (Si:C) for 32 nanometer (nm) technology nodes and beyond. The methodology disclosed is compatible with a gate-first or a gate-last high-k/metal gate (HKMG) CMOS integration flow.

BACKGROUND

The utilization of SSRW designs is known to enhance device performance while suppressing a short-channel effect. Various device designs use a step-doping channel profile using Si:C. These designs use Si:C due to its capability to form an excellent p-type (boron (B) or indium (In)) diffusion barrier and to form a steep channel profile for n-channel MOSFETs (NFETs). Conventionally, SSRW profiles are achieved by ion implantation, which is limited by the diffusion of p-type dopants during subsequent thermal processes and is more difficult in technology nodes below 20 nanometers (nm). SSRW profiles have also been achieved by forming the Si:C diffusion barrier by blanket epitaxial growth before the formation of shallow trench isolation (STI) regions.

FIGS. 1A through 1C depict the conventional process for forming a p-type step-doped channel profile in silicon wafer 101. FIG. 1A illustrates an undoped silicon substrate 101 on which a Si:C layer 105 and a silicon cap layer 103 are grown epitaxially. Adverting to FIG. 1B, oxide STI regions 107 are formed to isolate later formed semiconductor devices from each other. As illustrated in FIG. 1C, a high energy p-type well implant 109 (e.g. of B, In, or boron fluoride ($BF_2$)) is performed. (Alternatively, an N-well implantation, channel stop, or anti-punch through may be performed.) High energy and high dosage threshold voltage adjustment implants are required to achieve the desired dopant concentration 20 nm to 30 nm below the gate dielectric layer of the fabricated FET device. Due to limitations in the thickness of the photoresist material for such high energy and high dosage implantation, this method is difficult to apply for 20 nm and beyond fabrication technology. Further, this method cannot avoid dopant impurities in the channel surface region caused by the implanted ions migrating upwards during threshold adjust well implantation, thus causing threshold voltage variation and, therefore, degraded device performance.

If blanket epitaxial Si:C is grown after STI formation and chemical mechanical polishing (CMP) followed by an active silicon strip without precise control of step height between active regions and the field oxide, the active regions end up with a step height difference relative to the field oxide, causing process issues during later polysilicon gate electrode or replacement metal gate electrode formation. Polysilicon gate patterning is very sensitive to substrate topology and gate height varies significantly on the active regions and the field oxide at the gate CMP unless the step height is close to zero. Also, a blanket epitaxial growth may not be favorable to all FETs. For example, Si:C doping improves B diffusion for NFETs and may give some strain benefit (tensile) for NFETs. However, Si:C may not be favorable for PFETs (B source/drain profile may be changed). In most cases, the PFET threshold voltage increases with Si:C and may cause counter doping for threshold voltage centering, which could cause short channel control issues. Further, if carbon concentration needs to be high for NFETs, it may cause PFET ion degradation from tensile stress.

A need therefore exists for methodology enabling SSRW device formation which enables steep channel profile formation while using lower energy implants and the resulting device.

SUMMARY

An aspect of the present disclosure is an improved method of forming a step doping channel profile for a SSRW by performing deep and shallow well implantations prior to growing Si:C.

Another aspect of the present disclosure is a SSRW device, having Si:C grown on a doped silicon substrate, providing a step doped channel profile that can be sustained during subsequent thermal processing.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing STI regions in a silicon wafer; performing a deep well implantation of a dopant into the silicon wafer between STI regions; forming a recess in the doped silicon wafer between the STI regions; performing a shallow well implantation of the dopant into the silicon wafer in the recess; and forming carbon-doped silicon (Si:C) on the doped silicon wafer in the recess.

Aspects of the present disclosure include forming the recess by reactive ion etching (RIE). Further aspects include forming the recess by an anisotropic wet etch. Other aspects include annealing the doped silicon wafer prior to forming the Si:C in the recess. Another aspect includes forming the shallow well implantation at an energy of 5 kiloelectronvolts (keV) to 30 keV and at a dose of $2E13\ cm^{-2}$ to $1E14\ cm^{-2}$. Further aspects include forming the Si:C in the recess by epitaxially growing the Si:C to a thickness of 2 nm to 15 nm. Another aspect includes epitaxially growing silicon to a thickness of 2 nm to 15 nm on the Si:C. Additional aspects include epitaxially growing silicon to a thickness of 3 nm to 15 nm in the recess; amorphizing the epitaxially grown silicon; implanting carbon in the amorphized silicon; and thermally treating the implanted amorphized silicon. Other aspects include amorphizing the silicon by implanting germanium (Ge). Further aspects include thermally treating the implanted amorphized silicon by performing a spike rapid thermal anneal (RTA). An additional aspect includes epitaxially growing undoped silicon to a thickness of 0 nm to 15 nm in the recess subsequent to thermally treating the implanted amorphized silicon.)

Another aspect of the present disclosure includes a device including a doped silicon substrate; STI regions in the silicon substrate; and Si:C formed in a recess formed between STI regions.

In another aspect, the doped silicon substrate is formed by performing a deep well implantation prior to formation of the recess and a shallow well implantation subsequent to formation of the recess. In other aspects, the Si:C is formed by epitaxial growth to a thickness of 2 nm to 15 nm. In a further aspect, the device includes epitaxially grown silicon on the Si:C in the recess, the epitaxially grown silicon having a thickness of 2 nm to 15 nm. In another aspect, the Si:C is formed by: epitaxially growing silicon to a thickness of 3 nm to 15 nm in the recess; amorphizing the silicon; implanting carbon in the amorphized silicon; and thermally treating the amorphized silicon. In a further aspect, the device includes undoped epitaxially grown silicon on the Si:C in the recess, the undoped silicon having a thickness of 0 nm to 15 nm. In another aspect, the silicon is amorphized by implanting Ge. In an additional aspect, the amorphized silicon is treated by performing a spike RTA.

Another aspect of the present disclosure is a method including: providing STI regions in a silicon wafer; performing a deep well implantation of a p-type dopant into the silicon wafer between the STI regions; recessing the silicon wafer to a depth of 10 nm to 25 nm between the STI regions; implanting a p-type dopant into the recessed silicon wafer between the STI regions at an energy of 5 keV to 30 keV and at a dose of $2E13$ $cm^{-2}$ to $1E14$ $cm^{-2}$; forming Si:C on the doped silicon between the STI regions by: epitaxially growing Si:C or epitaxially growing undoped silicon, implanting Ge in the undoped silicon, implanting carbon in the Ge doped silicon, and performing a spike RTA; and epitaxially growing undoped silicon on the Si:C to a thickness of 0 nm to 15 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of impurities in the channel surface area and high energy and high dosage requirements attendant upon deep and shallow well implants performed after epitaxially growing Si:C on the silicon substrate. In accordance with embodiments of the present disclosure, deep and shallow well implantations are performed prior to growing Si:C. The well implantations are performed with a lower energy and lower dosage than prior methods. The resultant well-controlled or halo-controlled steep retrograde profiles are compatible with subsequent process flows.

Methodology in accordance with embodiments of the present disclosure includes forming a recess, for example by reactive ion etching (RIE) after deep well implants, followed by shallow well implants. A semiconductor material, such as Si:C, is then formed by epitaxial growth followed by a silicon cap layer. In another embodiment, silicon is epitaxially grown in the recess, amorphized by a pre-amorphizing implant (PAI), and implanted with carbon during a spike rapid thermal anneal (RTA).

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
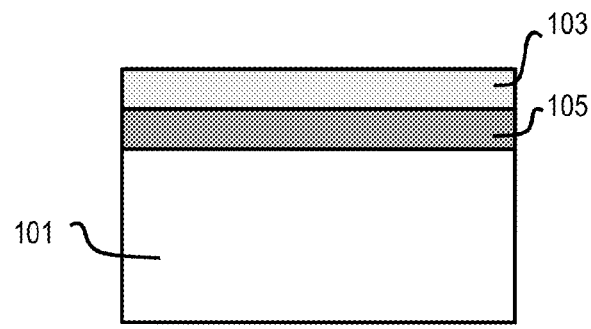
FIGS. 1A through 1C schematically illustrate a conventional process flow for obtaining a step-doped channel profile in a semiconductor device.
Figure 1B:
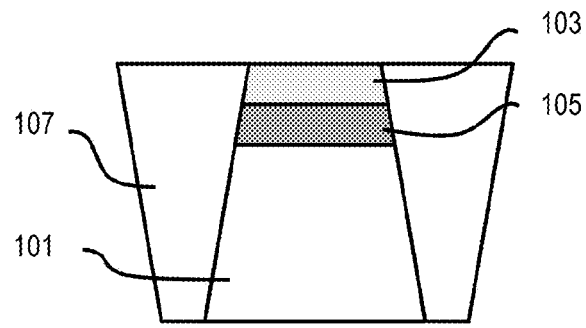
Figure 1C:
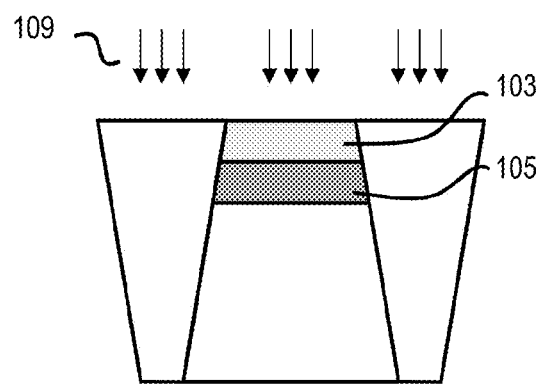
Figure 2A:
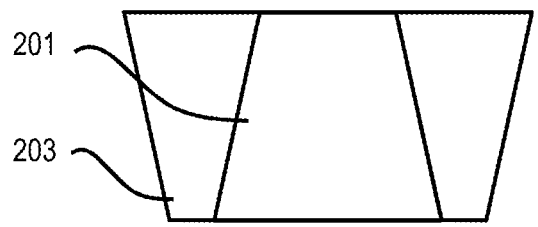
FIGS. 2A through 2D schematically illustrate a process flow for obtaining desirable step doping, in accordance with an exemplary embodiment.

A process flow for fabricating a semiconductor device in accordance with an exemplary embodiment of the present disclosure is depicted in FIGS. 2A through 2D. As illustrated in FIG. 2A, oxide STI regions 203 are formed in a silicon substrate 201 followed by chemical mechanical polishing (CMP). STI regions 203 isolate later formed semiconductor devices from each other.

Figure 2B:
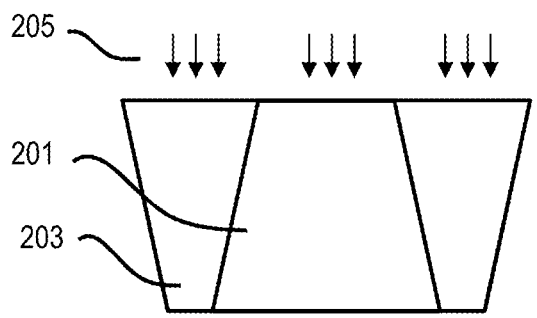

Adverting to FIG. 2B, a p-type (B, $BF_2$ or In) high-energy deep well implantation 205 is performed to form a deep P-well in the silicon substrate 201. (A deep N-well may alternatively be formed in the formation of a PFET in addition to a channel stop or anti-punch through layer.) For example, in an NFET, a p-type $BF_2$ implant can be performed at an energy level ranging from 5 keV to 30 keV and at a dosage ranging from $2E13$ $cm^{-2}$ and $1E14$ $cm^{-2}$.

Figure 2C:
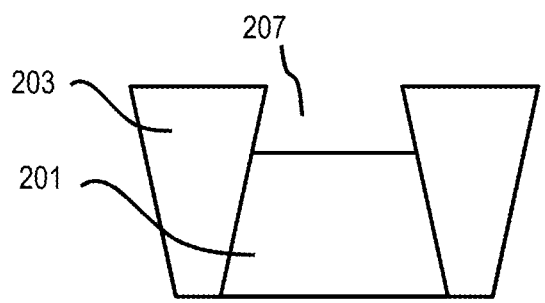

As illustrated in FIG. 2C a recess 207 is formed in silicon substrate 201 between STI regions 203. Recess 207 can be formed by an anisotropic dry etch, for example by RIE, or by an anisotropic wet etch, and can have a depth ranging from 15 nm to 25 nm. For a wet etch, chemistries including, for example, hydrogen bromide (HBr), chlorine ($Cl_2$), sulfur hexafluoride ($SF_6$), nitrogen trifluoride ($NF_3$), tetramethylammonium hydroxide (TMAH), tetraethylammonium hydroxide (TEAH), ammonium hydroxide, or combinations thereof may be used.

Figure 2D:
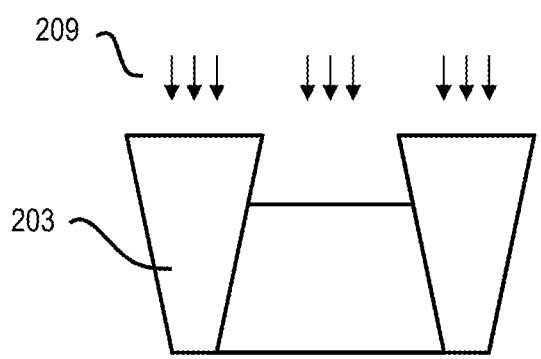

FIG. 2D illustrates a p-type (B, $BF_2$ or In) shallow well and threshold voltage adjustment implant 209 performed after the recess formation and any pre-cleaning steps that may be desired based on particular usage. Performing the shallow well implantation after forming the silicon recess, p-type dopant atoms loss is avoided during the recess process. In addition lower dose and energy levels may be employed, keeping photo resist (not shown for illustrative convenience) thickness lower (150 nm to 180 nm) for the threshold voltage adjustment implant. Implant 209 may be performed at an energy level ranging from 5 keV to 30 keV and a dosage level ranging from $2E13$ $cm^{-2}$ to $1E14$ $cm^{-2}$ for a p-type ($BF_2$) implant.

A well anneal may be performed subsequent to shallow well implant and threshold voltage adjustment implant 209 to activate the dopants. For example, the thermal treatment may include a spike RTA at approximately 1050° Celsius (C) for five seconds.

Figure 3A:
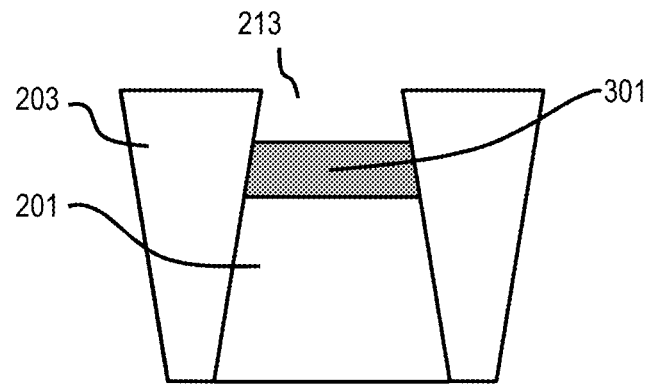
FIGS. 3A through 3B illustrate a process flow for forming a diffusion barrier in accordance with an exemplary embodiment.
Figure 3B:
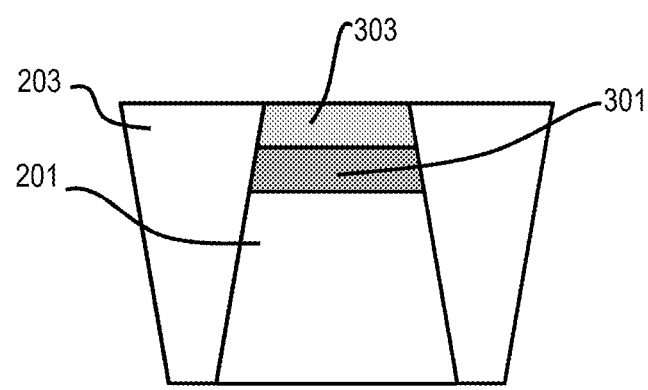

A process flow for forming a Si:C layer in recess 213 according to an exemplary embodiment is illustrated in FIGS. 3A through 3B. As illustrated in FIG. 3A, a Si:C layer 301 is formed in recess 213 on silicon substrate 201 between oxide STI elements 203. Si:C layer 301 is formed by epitaxial growth to a thickness of 2 nm to 15 nm, for example 5 nm, depending on the design parameters of the particular device being fabricated. FIG. 3B illustrates an undoped silicon cap layer 303 epitaxially grown on Si:C layer 301. Undoped intrinsic silicon layer 303 is epitaxially grown to a thickness of 2 nm to 15 nm, for example 10 nm, depending on the design parameters of the particular device being fabricated. Si:C layer 301 and silicon layer 303 are grown to suppress the B or In diffusion during subsequent thermal process steps to achieve p-type channel steep profiles in NFETs.

Figure 4A:
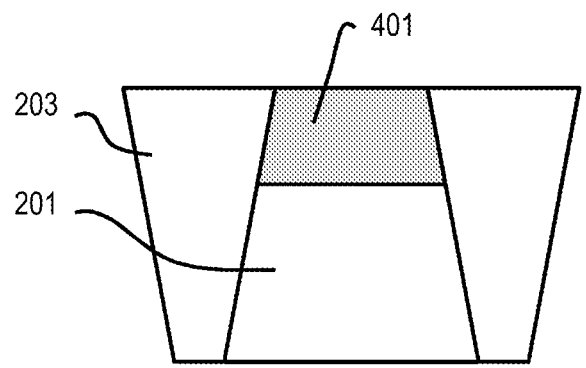
FIG. 4A through 4C illustrate a process flow for forming a diffusion barrier in accordance with another exemplary embodiment.
Figure 4B:
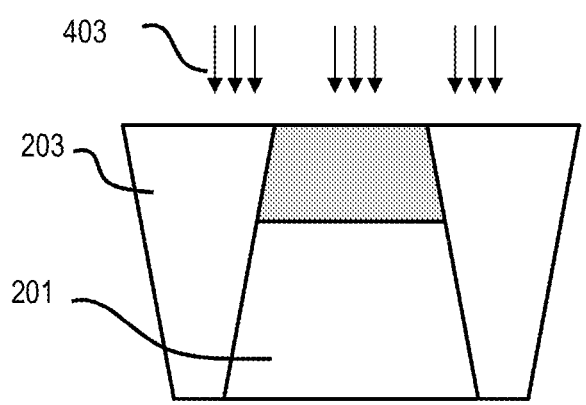
Figure 4C:
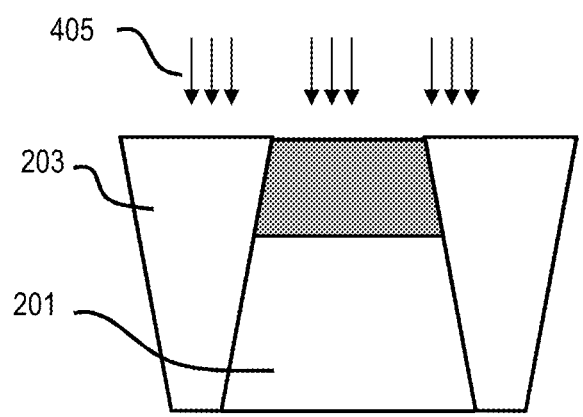

A process flow for forming a Si:C layer in recess 213 according to another exemplary embodiment is illustrated in FIGS. 4A through 4C. Adverting to FIG. 4A, an undoped silicon layer 401 is epitaxially grown on silicon substrate 201. Undoped silicon layer 401 may be grown to a thickness of 3 nm to 15 nm. Next, as illustrated in FIG. 4B, a Ge pre-amorphization implant 403 is performed to amorphize undoped silicon layer 401. The Ge implant 403 can be performed at a dosage from $3E14$ $cm^{-2}$ to $1E15$ $cm^{-2}$ and at an energy level of 9 keV to 20 keV.

As illustrated in FIG. 4C, carbon implant 405 is performed during a solid-phase epitaxial regrowth phase of undoped silicon layer 401. The carbon dosage can range from $3E14$ $cm^{-2}$ to $2.5E15$ $cm^{-2}$, for example $2E15$ $cm^{-2}$, and the energy level for the carbon implantation may range from 4 keV to 7 keV. Most of the implanted carbon in the recrystalized region is placed in substitutional positions. Substitutional carbon is known to trap interstitials by carbon pairs and clusters most efficiently to retard boron diffusion from the bottom p-type doped regions toward the channel surface. Because the interstitial mediated diffusion of B/In dominates the vacancy mediated one and the interstitial undersaturation and vacancy super-saturation due to the presence of carbon results in an overall reduction of B or In diffusion during subsequent thermal process steps, p-type channel steep profiles can be achieved in NFETs.

Carbon implant 405 can be followed by thermal treatment, for example a spike RTA or a laser spike anneal, to re-crystalize the amorphized silicon. The spike RTA can be performed, for example, at a temperature that ranges from 800° C. to 1050° C. and for a duration of approximately five seconds, or alternatively the laser spike anneal may be performed, for example, at 1250° C. for a duration of 0.8 milliseconds.

Although not shown for illustrative convenience, an additional undoped silicon layer may be epitaxially grown on the silicon layer 401 subsequent to the carbon implantation and anneal. The additional undoped silicon layer may be grown to a thickness of up to 15 nm.

The embodiments of the present disclosure can achieve several technical effects, including formation of steep channel profiles in SSRW devices with lower energy threshold voltage adjustment implants and, additionally, fewer impurities in the channel surface area. As a result, short channel effects as well as threshold voltage variation are suppressed. The present disclosure enjoys industrial applicability in fabricating any of various types of highly integrated semiconductor devices, particularly for 32 nm technology products and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing shallow trench isolation (STI) regions in a silicon wafer;
   performing a deep well implantation of a dopant into the silicon wafer between STI regions;
   forming a recess in the silicon wafer between the STI regions;
   performing a shallow well implantation of the dopant into the silicon wafer in the recess; and
   forming carbon-doped silicon (Si:C) on the silicon wafer in the recess.

2. The method according to claim 1, comprising forming the recess by reactive ion etching (RIE).

3. The method according to claim 1, comprising forming the recess by an anisotropic wet etch.

4. The method according to claim 1, comprising annealing the silicon wafer prior to forming the Si:C in the recess.

5. The method according to claim 1, comprising forming the shallow well implantation at an energy of 5 kiloelectronvolts (keV) to 30 keV and at a dose of 2E13 to 1E14.

6. The method according to claim 1, comprising forming the Si:C in the recess by epitaxially growing carbon-doped silicon (Si:C) to a thickness of 2 nanometers (nm) to 15 nm.

7. The method according to claim 6, further comprising epitaxially growing silicon to a thickness of 2 nm to 15 nm on the Si:C.

8. The method according to claim 1, comprising forming the Si:C in the recess by:
   epitaxially growing silicon to a thickness of 3 nm to 15 nm in the recess;
   amorphizing the epitaxially grown silicon;
   implanting carbon in the amorphized silicon; and
   thermally treating the implanted amorphized silicon.

9. The method according to claim 8, comprising amorphizing the silicon by implanting germanium (Ge).

10. The method according to claim 8, comprising thermally treating the implanted amorphized silicon by performing a spike rapid thermal anneal (RTA).

11. The method according to claim 8, further comprising epitaxially growing undoped silicon to a thickness of 0 nm to 15 nm in the recess subsequent to thermally treating the implanted amorphized silicon.

12. A method comprising:
   providing shallow trench isolation (STI) regions in a silicon wafer;
   performing a deep well implantation of a p-type dopant into the silicon wafer between the STI regions;
   recessing the silicon wafer to a depth of 10 nanometers (nm) to 25 nm between the STI regions;

implanting a p-type dopant into the silicon wafer between the STI regions at an energy of 5 kiloelectronvolts (keV) to 30 keV and at a dose of 2E13 to 1E14;
forming carbon-doped silicon (Si:C) on the doped silicon between the STI regions by:
epitaxially growing Si:C or
epitaxially growing undoped silicon, implanting germanium (Ge) in the undoped silicon, implanting carbon in the Ge doped silicon, and performing a spike rapid thermal anneal (RTA); and
epitaxially growing undoped silicon on the Si:C to a thickness of 0 nm to 15 nm.

* * * * *